(12) United States Patent
Gehoski et al.

(10) Patent No.: US 6,737,202 B2
(45) Date of Patent: May 18, 2004

(54) METHOD OF FABRICATING A TIERED STRUCTURE USING A MULTI-LAYERED RESIST STACK AND USE

(75) Inventors: Kathleen Ann Gehoski, Gilbert, AZ (US); Laura Popovich, Chandler, AZ (US); David P. Mancini, Fountain Hills, AZ (US); Doug J. Resnick, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 12 days.

(21) Appl. No.: 10/081,199

(22) Filed: Feb. 22, 2002

(65) Prior Publication Data

US 2003/0162406 A1 Aug. 28, 2003

(51) Int. Cl.$^7$ ............................................. H01L 21/302
(52) U.S. Cl. ......................... 430/5; 438/725; 438/704; 438/717; 438/951; 438/670
(58) Field of Search ............................ 430/5; 438/725, 438/717, 704, 951, 670; 134/1.2, 1.3; 216/40

(56) References Cited

U.S. PATENT DOCUMENTS

| | | | |
|---|---|---|---|
| 4,975,382 A | | 12/1990 | Takasugi |
| 5,122,387 A | * | 6/1992 | Takenaka et al. ........... 427/493 |
| 5,338,703 A | * | 8/1994 | Matsuoka .................. 438/577 |
| 5,981,319 A | * | 11/1999 | Lothian et al. ............. 438/167 |
| 6,051,454 A | | 4/2000 | Anda et al. |
| 6,387,783 B1 | * | 5/2002 | Furukawa et al. .......... 438/574 |

FOREIGN PATENT DOCUMENTS

| | | | |
|---|---|---|---|
| EP | 0 372 790 | | 6/1990 |
| JP | 07-201889 | * | 8/1995 |
| JP | 11150129 | | 6/1999 |

* cited by examiner

Primary Examiner—George A. Goudreau
(74) Attorney, Agent, or Firm—William E. Koch

(57) ABSTRACT

An improved and novel method of forming a tiered structure, such as a T-gate structure, including the fabrication of a stabilized resist layer that provides for the prevention of interlayer intermixing with the deposition of subsequent resist layers. The method includes patterning a base resist layer to provide for an opening which will form the stem of the tiered structure and subsequently stabilizing the resist base layer without deforming the stem opening. Next, a resist stack is deposited on an uppermost surface of the stabilized resist layer. Patterning the resist stack provides for an opening on an uppermost layer or portion, and a reentrant profile in a portion of the resist stack adjacent the stabilized resist layer. Metallization and subsequent removal of the resist layers results in a tiered structure, such as a T-gate structure, formed using only low to medium molecular weight, linear polymeric materials such as those used in positive optical resists in optical lithography.

24 Claims, 2 Drawing Sheets

METHOD OF FABRICATING A TIERED STRUCTURE USING A MULTI-LAYERED RESIST STACK AND USE

FIELD OF THE INVENTION

The present invention relates to semiconductor processing techniques, and more particularly to the fabrication of a tiered structure using optical lithography methods and base layer stabilization to prevent interlayer mixing and a method of forming a semiconductor device with the tiered structure.

BACKGROUND OF THE INVENTION

Gate structures in FET devices are a critical component affecting device performance. Gate structures on many current metal semiconductor field effect transistors (MESFETs) and high electron mobility transistors (HEMTs) use metals, such as gold (Au), to achieve the low noise, low resistance performances required. Due to the non-reactive nature of these metals and the difficulty in etching them, additive fabrication techniques, such as evaporative metal deposition and lift-off processing, are typically employed in the manufacturing of these gates.

During operation, the speed of a transistor is inversely related to the length of the gate with smaller gates providing faster switching times. This is because a gate with a small foot or stem (length) offers less gate capacitance. However, one drawback is that such a gate having a conventional rectangular cross sectional area is more resistive as the gate length decreases, because its cross sectional area decreases. Improved gate performance can be attained if a gate is fabricated to have a small length or foot dimension, but a larger top section having a larger cross sectional area. The small foot or stem (gate length) attached to the substrate minimizes gate capacitance, while the larger structure or head on top allows for low gate resistance. This tiered structure now resembles a T and so this type of gate is commonly referred to a T-shaped gate or simply a T-gate. In many instances, this structure is also referred to as a Y-gate or a mushroom gate due to its final shape, which depends upon the method used to deposit the metal. Deposition methods such as evaporation or sputtering result in a gate structure which is dimpled at the top and thus take the shape of a Y. Metal deposition which is done from the bottom up such as by plating, results in a gate structure which is more rounded in profile, thus resembling a mushroom. In either case, the cross-sectional dimension is not uniform and thus is deemed a tiered structure. In yet another instance, a tiered structure known as a gamma-gate can be produced. A gamma-gate is fabricated to include a top tier which is not centrally aligned with the bottom tier, or stem portion. This can be easily done by purposeful and controlled misalignment during lithography of the top tier with respect to the bottom tier. Accordingly, use of the terms T-gate, Y-gate and gamma-gate are all synonymous terms, since all apply to tiered structures having slightly different cross-sectional shapes. In this disclosure the term T-gate, the most common term in the art, is intended to encompass all of these structural variations.

Typically, T-gate structures are used in high performance devices, as they give lower noise performance, higher gain, and higher cutoff frequencies as compared to simple rectangular gates. In a metal T-gate the upper, wider part of the gate increases the cross-section of the gate, which reduces the gate resistance. So where a small gate length reduces noise, a T-gate with a small gate length reduces noise even more.

Fabrication of a metal structure such as a gate using an additive metallization process, requires that a liftoff resist process be used. In a liftoff resist process, special techniques and resist materials are used to form a retrograde or re-entrant resist profile. Here the top of the resist is opened more narrowly than the bottom of the resist which is processed to open more widely, forming the desired profile. This is in contrast to conventional resist processing such as when resist is used as an etch mask. Here, it is advantageous that the resist profile be either vertical or have a slightly positive slope. There are many known resist processes used for liftoff fabrication, but all have in common this retrograde profile. The most commonly used processes employ two different resist materials which are layered one on the other to form a bilayer stack. The two materials have different exposure and dissolution characteristics which cause each to have a different development rate. The bottom layer is generally a somewhat isotropically developing, low contrast resist and is made to develop laterally more than the top layer. The top layer is a more anisotropically developing, high contrast layer used to define the opening for metal deposition and ultimately define the metal structure's dimension (length). Other processes have made clever use of resist chemistry and have achieved a similar retrograde profile in only a single layer. This is done by controlled diffusion of a neutralizing agent into the top surface of the resist to a limited depth. This neutralizing agent (typically a base) slows the dissolution rate of the resist near the top of the resist layer where the concentration of the agent is greatest. Dissolution rate is unaffected below a certain depth into the resist, where development occurs at a normal rate. The slowed rate for the top compared to the bottom portions of the resist layer combine to create a retrograde profile.

A T-gate is a special type of structure, and like conventional rectangular gates, can be fabricated using additive metallization and liftoff processing. However, since a T-gate is an example of a tiered structure, the resist process is more complicated since an additional tier of resist is needed to form the stem of the T shape. As with conventional liftoff processing, many types of T-gate processes have been proposed. All have in common a high resolution opening in the base resist layer used to form the narrow part, the stem. A conventional bilayer or single layer liftoff resist process is built on top of the base layer which forms the wider, current flowing, top portion of the gate. Once the complete stack is built, metal is deposited into the opening and fills the structure starting from the bottom (base or stem section) and proceeds through the top section, stopping when the desired thicknesses are achieved.

Electron-beam lithography has been often used for the fabrication of T-gate resist profiles. E-beam offers the highest resolution possible, a factor which is necessary for creation of small gate lengths which play a key role in gate performance. However, many other factors are beneficial and naturally inherent to e-beam lithography, and are in contrast, absent from optical lithography. Such factors add additional favor to e-beam lithography as a means of fabricating T-gate resist profiles. The two most important of these are, the transparency of e-beam resists to high energy electrons, and the insolubility of e-beam resists which allow for multi-level stacking.

Polymeric materials used as e-beam resists are largely transparent to high energy electrons used for exposure. For this reason, it is well known in the art that a single e-beam exposure, coupled with the correct tri-layer resist stack and selective developers is adequate to expose a completed T-gate resist profile. This is not true of other types of lithography such as optical lithography where resist materials are largely absorbing making it impossible to pattern, with the highest resolution, the base layer through the adjacent overlayers. In addition, many commonly used e-beam resists such as PMMA (poly methylmethacrylate) have a very high molecular weight (MW) (often>1,000,000) and achieve development contrast through e-beam induced chain scissions which dramatically reduce MW in exposed areas. Rapid development of exposed areas occurs since lower molecular weight polymers dissolve much more rapidly than high molecular weight polymers. The relative insolubility of unexposed high MW e-beam resists also allows them to be coated in adjacent laminar layers without interlayer mixing or solvent attack from the next layer to be coated. This low solubility is a key enabling factor which allows a complicated T-gate liftoff resist stack to be built. Optical resists are not chain scissioned upon exposure, but chemically react to form more soluble products. However, even unexposed, they are highly soluble compared to conventional e-beam resists due in part to their relatively low MW (<100,000 typically), and thus are subject to intermixing and solvent attack from subsequent layers. It should be pointed out that while the molecular weight of a polymer affects its solubility, structural features which determine the polarity of the polymer also play a role.

For these reasons conventional novolak/DNQ (diazonapthoquinone) or chemically amplified optical resists are not used for T-gate fabrication. The one exception to this is the case where a negative acting resist is patterned as the base layer using optical methods, and the cap portion is created by an alignment and exposure of a second mask. This works since this type of negative resist, is by its nature crosslinked. Its crosslinked structure gives it a very high MW and low solubility. Such a layer used as the base of a T-gate is unaffected by subsequent resist layer applications. Other methods of fabricating T-gates which do not use resist materials as base layers have been proposed. Using these methods, T-gates are created by first forming the stem by etching into a film, such as oxide or nitride. This is followed by a bi-layer lift-off process to create the cap section.

However, all of the above methodologies are inadequate when proposed for use in a manufacturing environment where simplicity and reliability are required. E-beam tools, while offering high resolution, are very slow and have extremely poor throughput. Using an oxide or nitride process to form the stem adds many steps to the fabrication process, and is inherently inefficient. These additional materials also create additional undesirable device parasitics such as increased gate capacitance which detract from device performance. In addition, negative resists are not widely accepted by industry and thus are not used in modern fab environments; only positive resists are used. Therefore, the most valuable process for forming T-gates is one which would use only modern high throughput optical lithographic methods, tooling, and materials to form the entire required resist structure. This can only be done using modern positive i-line and chemically amplified deep ultra violet (DUV) resists, with a technique that is also extendable to next generation lithography tooling and resist materials such as 193 nm, 157 nm, 126 nm and Extreme Ultra Violet Lithography (EUVL).

Accordingly, it is an object of the present invention to provide for a method of fabricating a tiered structure, such as a T-gate structure, utilizing optical lithography methods.

It is another object of the present invention to provide for a method of fabricating a tiered structure in which a stabilized resist base layer is fabricated to prevent interlayer mixing during subsequent layer fabrication.

It is yet another object of the present invention to provide for a method of fabricating a tiered structure in which standard and conventional resist materials are utilized without the sacrifice of any resolution needed to form the structure.

It is still a further object of the present invention to provide for a method of fabricating a tiered structure utilizing positive resists composed of moderate molecular weight, linear polymer chains.

SUMMARY OF THE INVENTION

These needs and others are substantially met through provision of a method for fabricating a tiered structure, such as a T-gate structure, including the steps of providing a substrate and depositing on the uppermost portion of the substrate, a plurality of organic resist layers. A first resist layer is deposited on the substrate and a trench for a gate stem is formed in the layer, by imaging with a radiation source. The resist layer undergoes a stabilization process in which radiation and/or heat are applied to the layer, thereby causing the layer to react and cross-link without destroying or deforming the trench formed for the gate stem. Next, a resist stack is deposited on the stabilized layer. Due to the stabilizing of the first resist layer, there is no deforming effect on this layer upon the introduction of the resist stack. The resist stack is next aligned, exposed and developed thereby providing for the opening of a large trench over the trench formed for the gate stem. A re-entrant profile is formed in a portion of the resist stack adjacent the stabilized resist layer. A metal is deposited in the formed trench opening, and the organic layers are subsequently removed to expose the tiered structure.

BRIEF DESCRIPTION OF THE DRAWINGS

The foregoing and further and more specific objects and advantages of the present invention will become readily apparent to those skilled in the art from the following detailed description of a preferred embodiment thereof taken in conjunction with the drawings, in which.

DETAILED DESCRIPTION OF THE PREFERRED EMBODIMENTS

In developing a tiered structure, such as a T-gate structure, according to the present invention, the challenge lies in creating a tiered structure using only positive resists composed of polymeric materials having a low to medium molecular weight. In order to accomplish this, several issues must be overcome. First, resist compatibility must be taken into account. Low to medium molecular weight (MW) i-line and deep ultra violet (DUV) resists tend to intermix when other layers are coated on top of them. Use of these resists as the bottom resist layer must somehow avoid intermixing. Second, resist/developer compatibility must be examined. Resists and developers must be chosen in such a way to affect only the layer(s) intended. Third, bake temperature compatibility must be dealt with. As the stack is built, care must be taken so that subsequent bake temperatures will not affect the previous layers. Finally, resist transparency is a factor that must be considered in multi-layer resist systems. Resist materials must be selected so that exposure(s) will affect the resist layer(s) in the desired way.

Figure 1:
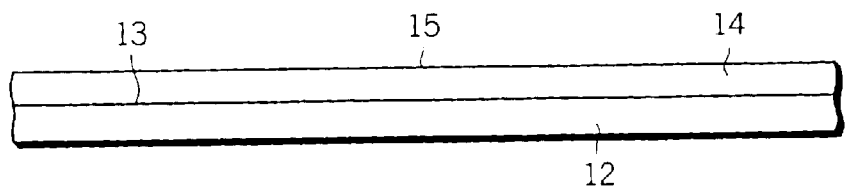
FIGS. 1–8 illustrate cross-sectional views of the steps in fabricating a tiered structure according to the present invention.

Referring now to the drawings, illustrated in FIGS. 1–7 are steps in the fabrication of a tiered structure, and more specifically a T-gate structure, according to the present invention. It should be understood that during the course of this description, like numbers are used to identify like elements according to the different figures that illustrate the invention. Accordingly, FIG. 1 illustrates in simplified cross-sectional view a first step in the method of fabricating a tiered structure according to the present invention. Illustrated in FIG. 1 is a first step in the fabrication of the semiconductor device of the present invention, generally referenced 10, including the providing of a substrate 12. Substrate 12 is described as being formed of a material chosen from the group consisting of: a column III–V compound semiconductor material, glass, metal, and silicon. More specifically, in this particular embodiment, substrate 12 is described as being formed of an InP material. It should be understood, that anticipated by this disclosure is the fabrication of substrate 12 of an InGaAs material, a GaAs material, silicon, or any other materials commonly utilized in the fabrication of semiconductor devices.

Substrate 12, has disposed on an upper surface 13, a base resist layer 14, or first resist layer. It is disclosed that base resist layer 14 is formed of an organic, photosensitive or photoimageable material which is disposed on surface 13 of substrate 12, using typical resist deposition techniques. More specifically, base resist layer 14 is deposited on surface 13 of substrate 12 using standard spin-coating techniques, thereby providing for base resist layer 14 to have a planarized uppermost surface 15.

In this particular embodiment, base resist layer 14 is disclosed as formed of a thin layer of an organic photosensitive material, such as novolak, or other similar material that is soluble and has a low molecular weight. It should be understood that anticipated by this disclosure is the fabrication of base resist layer 14 using a moderate or high molecular weight soluble material. According to this disclosure, low molecular weight materials include those materials having a molecular weight of less than 20,000. Medium molecular weight materials include those materials having a molecular weight of 20,000–200,000. High molecular weight materials include those materials having a molecular weight of more than 200,000. Base resist layer 14 in this particular embodiment is deposited at a thickness of less than 300 nm, preferably with a thickness of 150–300 nm, using standard spin coating techniques, well known in the industry.

Figure 2:
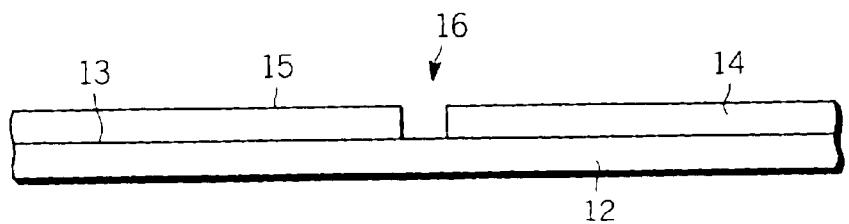

During fabrication, base resist layer 14 is next developed as illustrated in FIG. 2, by imaging layer 14 with a light, electrons or other irradiating source, so as to form an opening 16 in resist layer 14. Opening 16 provides for the fabrication of a gate stem (discussed presently). Next, the remaining portions of base resist layer 14 undergo a stabilization process in which base resist layer 14 is cross-linked by applying irradiating light and heat to layer 14. It should be understood that additionally anticipated by this disclosure is the stabilization of base resist layer 14 by electron beam radiation combined with heat, by electron beam radiation alone, by irradiating light alone, or by heat alone. During this cross-linking process, base resist layer 14 undergoes a chemical reaction, causing the molecular weight of the material to increase, without destroying opening 16, or more particularly the gate stem opening. Anticipated is the use of irradiating light having wavelengths from 150 nm to 1000 nm. More specifically, the choice of wavelength depends upon the chemical structure of the base layer and is chosen so as to affect a cross-linking of base resist layer 14. In a preferred embodiment, deep ultraviolet light, having a wavelength between 220–365 nm, is directed toward base resist layer 14, during the stabilization process, although it is anticipated by this disclosure to extend this exposure to other wavelengths including broadband illumination. The intensity of the light, as well as the heat, and the time in which both must be applied to achieve cross-linking, is controllable so as to achieve maximum benefits. This process of photostabilization provides for a dramatic reduction of the solubility of base resist layer 14 in a solvent and results in a stabilized base resist layer 14.

Figure 3:
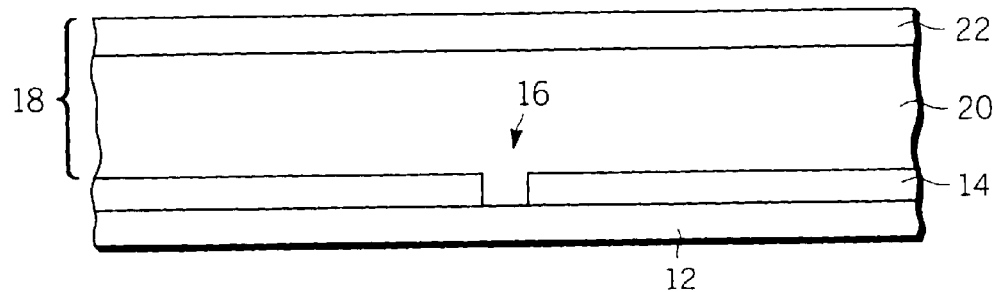
Figure 4:
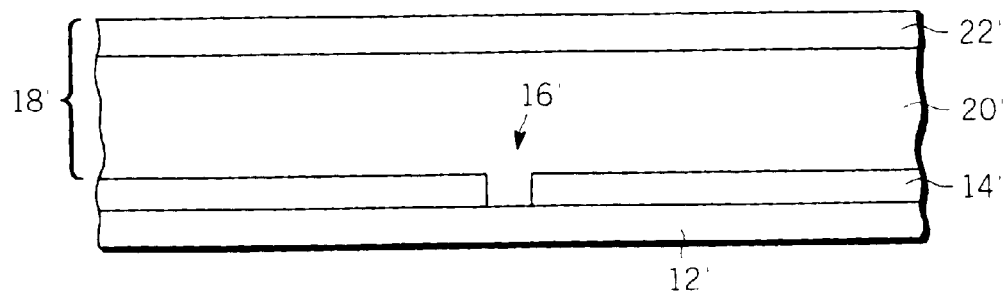

Referring now to FIGS. 3 and 4, the wafer stack, generally referenced 10, is next coated with an organic, resist stack 18 which is deposited on an uppermost surface 15 of stabilized base resist layer 14. During fabrication, resist stack 18 is deposited on surface 15 of stabilized base resist layer 14 by spin coating, or some other similar technique known in the art for depositing resist layers. In a preferred embodiment, resist stack 18 is formed of multiple layers, consisting of one or more layers of photo-imageable organic resist layers, including those materials that are optically and/or electron beam sensitive. Illustrated in FIG. 3, is an organic resist stack 18 formed as a standard bilayer resist, including resist layers 20 and 22. Illustrated in FIG. 4, in the alternative, is an organic resist stack 18' formed as a standard single layer resist. It should be noted that all components of FIG. 4 that are similar to the components illustrated in FIG. 3, are designated with similar numbers, having a prime added to indicate the different embodiment.

Referring more specifically to FIG. 3, in this particular embodiment, resist stack 18 is formed of resist layer 20 that is more isotropically developing than stabilized base resist layer 14 or subsequent resist layer 22.

Resist layer 22 is typically formed of a low molecular photoimageable material, similar to the material forming stabilized base resist layer 14. Due to the stabilization of base resist layer 14, there is no intermixing of materials, or deformation of stabilized base resist layer 14 with this subsequent deposition of resist layers 20 and 22.

In the alternative, and as illustrated in FIG. 4, organic resist stack 18', formed as a standard single layer resist, undergoes a diffusion step during processing. During this step, a chemical transformation of stack 18' results in a bi-layer stack wherein a portion 20' of resist stack 18' formed nearer the surface of stabilized base resist layer 14' is more isotropically developed and thus more soluble, than a portion 22' of resist stack 18' formed in the uppermost portion of the resist stack 18'. More specifically, during fabrication resist stack 18' is immersed in an aqueous base solution, wherein the base within the developer diffuses into the uppermost portion 22' of resist stack 18'. This diffusion of the base into uppermost portion 22' of resist stack 18' results in a bi-layer resist including portion, or layer, 20', which is similar to the initial base resist layer 14 prior to stabilization, and portion, or layer, 22'. It should be understood, that resist stack 18 (18'), irrespective of being formed as a single layer resist stack, or a multiple layer resist stack, is formed as a positive resist.

Figure 5:
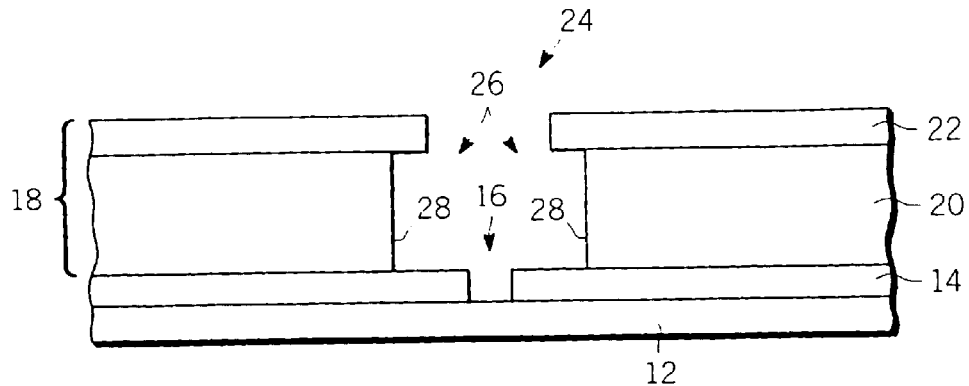

Referring now to FIG. 5, wafer stack 10, and more specifically, resist stack 18, is next developed and patterned using standard lithographic methods, such as electron beam radiation, optical irradiation, or the like. During development, the exposed area of stack 18 is removed, thereby defining an opening 24 and forming the pattern. As illustrated in FIG. 4, an opening having a re-entrant profile 26 is formed during development in resist layer 20, due to the specific properties present in resist layer 20. More specifically, negative sloping occurs to form sidewalls 28 in resist layer 20, thereby forming the opening for the uppermost portion of the T which forms the T-gate structure. It should be understood that during fabrication, opening 24 formed to define the dimension of the uppermost portion of the tiered structure has a preferred dimensional ratio of at least 2:1 with respect to opening 16 which forms the stem portion of the T-gate structure. In a preferred embodiment, opening 16 has a dimension of approximately 250 nanometers microns, and opening 24 has a dimension of approximately 750 nanometers. Opening 24 is described as having a dimension that is less than opening 26, but greater than opening 16.

Figure 6:
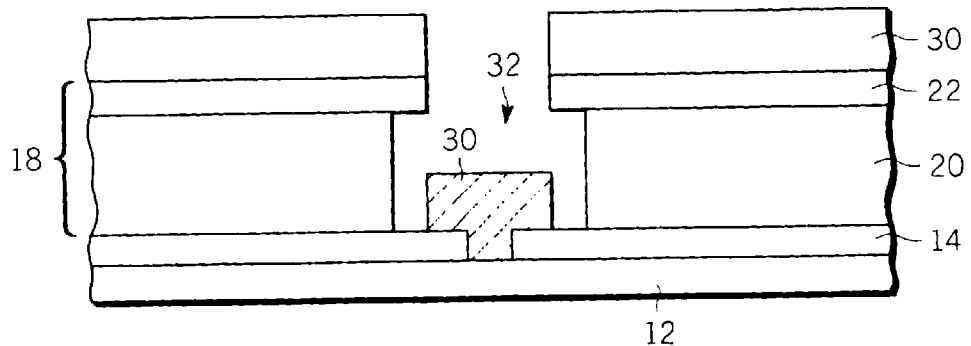

Subsequent to the patterning of resist stack 18, metallization takes place whereby a conductive metal material 30 is deposited within openings 24, 26, and 16, thereby forming a tiered structure 32, and in this particular example, a T-gate structure, as illustrated in FIG. 6. Prior to metallization, stack 10 is first soaked in a 10% $NH_4OH$ solution for a duration of typically 1 to 5 minutes. The soaking of stack 10 in the $NH_4OH$ solution provides for the cleaning of the exposed surfaces prior to metallization. Metallization occurs by evaporation of sputtering techniques, well known in the art. It is anticipated by this disclosure, that any type of conductive metal, such as gold (Au), titanium (Ti), or the like can be used during the metallization process to form tiered structure 32.

Figure 7:
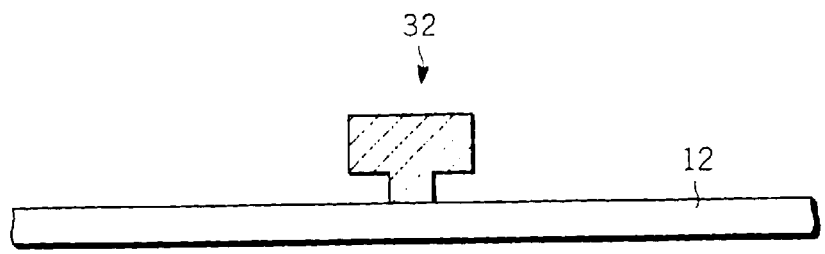

As illustrated in FIG. 7, resist stack 18, including resist layers 20 and 22, and any metal 30 deposited on layer 22 during the metallization process, are removed. This step of removal may be done by techniques including a solvent bath immersion to remove resist stack 18, and dry oxygen plasma etching, or the like, to remove the stabilized base resist layer 14. The result is the fabrication of tiered structure 30, and more particularly the T-gate structure, as illustrated.

Figure 8:
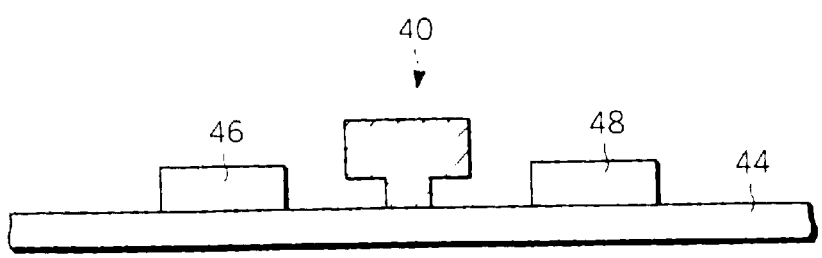

Referring now to FIG. 8, illustrated is a process of fabricating a semiconductor device 42, including the step of fabricating a tiered structure 40, generally similar to T-gate 32 of FIG. 7. Semiconductor device 42 in this particular embodiment is formed as a transistor. It should be understood that while the manufacturing of a semiconductor device, and specifically a transistor, is described with respect to FIG. 8, that the manufacture of additional microelectronic devices that utilize tiered structures is anticipated by this disclosure.

Semiconductor device, or transistor, 42 is formed by initially providing a semiconductor substrate 44. A source 46 and a drain 48 are formed on an uppermost surface of the semiconductor substrate. Source 46 and drain 48 in this particular embodiment are formed as a layered structure, comprised of a semiconductor material, such as germanium (Ge), sandwiched between two metallic layers, such as nickel (Ni), and gold (Au). It should be understood that although these specific source and drain materials are disclosed, alternative materials commonly used for source and drain structures are intended to be included herein. Next, a tiered structure 40, such as a T-gate, is fabricated in accordance with the description given for FIGS. 1–7. Tiered structure 40 is positioned between source 46 and 48 to form complete semiconductor device, or transistor, 42.

Thus, a method for fabricating a tiered structure, such as a T-gate structure, and a device in which the tiered structure is used, is disclosed. The tiered structure includes an initially deposited resist layer that is stabilized, thereby providing for the subsequent deposition of a resist stack without deforming a stem opening formed in the stabilized layer. The inclusion of a stabilized resist layer provides for subsequent resist layer deposition without interlayer intermixing. This enhancement of the resist properties provides for improved fabrication of semiconductor devices, including the ease with which subsequent deposition of resist layers is achieved.

What is claimed is:

1. A method of forming a tiered structure using a multi-layered resist stack comprising the steps of:
   providing a substrate having a surface;
   depositing and patterning a base resist layer on the surface of the substrate;
   stabilizing the patterned base resist layer, thereby forming a stabilized resist layer;
   forming a resist stack including an isotropically developing material formed on an uppermost surface of the stabilized resist layer and an imageable material formed on a surface of the isotropically developing material;
   patterning, in alignment with an opening defined in the stabilized resist layer, an opening in the resist stack having a reentrant profile and a dimension greater than the opening defined in the stabilized resist layer;
   depositing a metal material within the opening defined therein the resist stack and the opening defined therein the stabilized resist layer; and
   removing the resist stack and the stabilized resist layer, thereby exposing a tiered structure.

2. A method of forming a tiered structure using a multi-layered resist stack as claimed in claim 1 wherein the tiered structure is a T-gate structure.

3. A method of forming a tiered structure using a multi-layered resist stack as claimed in claim 2 wherein the step of providing a substrate having a surface includes providing a substrate formed of a semiconductor material.

4. A method of forming a tiered structure using a multi-layered resist stack as claimed in claim 1 wherein the step of depositing a base resist layer includes depositing a low to medium molecular weight, soluble, organic imageable material.

5. A method of forming a tiered structure using a multi-layered resist stack as claimed in claim 3 wherein the step of stabilizing the patterned base resist layer includes the step of exposing the base resist layer to one of a heat source, a light source, a heat source and a light source, an electron beam irradiation source, and an electron beam irradiation source and a heat source, thereby increasing the molecular weight of the base resist layer through cross-linking, forming the stabilized base resist layer.

6. A method of forming a tiered structure using a multi-layered resist stack as claimed in claim 5 wherein the step of exposing the base resist layer to a light source includes exposing to an deep ultraviolet light source.

7. A method of forming a tiered structure using a multi-layered resist stack as claimed in claim 5 wherein the step of depositing the resist stack on an uppermost surface of the stabilized resist layer includes forming a multiple layer resist stack.

8. A method of forming a tiered structure using a multi-layered resist stack as claimed in claim 5 wherein the step of depositing a metal material includes depositing a conductive metal material.

9. A method of forming a tiered structure using a multi-layered resist stack as claimed in claim 5 wherein the step of removing the resist slack and its stabilized base resist layer includes immersing the stack in a solvent bath immersion to remove the resist stack and etching to remove the stabilized base resist layer.

10. A method of forming a tiered structure using a multi-layered resist stack comprising the steps of:
provide a semiconductor substrate having a surface;
depositing a soluble organic imageable material on the surface of the substrate, thereby forming a base resist layer;
patterning the base resist layer to define therein an opening having a first dimension;
stabilizing the base resist layer by exposing the base resist layer to one of a light source, a heat source, a combination of a light source and a heat source, an electron beam irradiation source, and a combination of an electron beam irradiation source and a heat source, thereby increasing the molecular weight of the base resist layer through cross-linking and forming a stabilized resist layer having an opening defined therein;
forming a resist stack including an isotropically developing material formed on an uppermost surface of the stabilized resist layer and an imageable material formed on a surface of the isotropically developing material;
patterning, in alignment with an opening defined in the stabilized resist layer, an opening in the imageable material and an opening in the isotropically developing material having a reentrant profile and a dimension greater than the opening defined in the stabilized resist layer;
depositing a metal material within the openings defined therein the resist stack and the opening defined therein the stabilized resist layer; and
removing the resist stack and the stabilized resist layer, thereby exposing a tiered structure.

11. A method of forming a tiered structure using a multi-layered resist stack as claimed in claim 10 wherein the tiered structure is a T-gate structure.

12. A method of forming a tiered structure using a multi-layered resist stack as claimed in claim 10 wherein the step of providing a substrate having a surface includes providing a substrate formed of a semiconducting material chosen from the group consisting of: column III-V compound semiconductors, glass, metals, silicon.

13. A method of forming a tiered structure using a multi-layered resist stack as claimed in claim 10 wherein the step of depositing a base resist layer includes depositing a low to medium molecular weight soluble organic imageable material.

14. A method of forming a tiered structure using a multi-layered resist stack as claimed in claim 10 wherein the step of exposing the base resist layer to a light source includes exposing to a deep ultraviolet light source.

15. A method of forming a tiered structure using a multi-layered resist stack as claimed in claim 10 wherein the step of depositing a resist stack on an uppermost surface of the stabilized resist layer includes the step of creating a reentrant resist profile in the upper resist layer by diffusing a base into an uppermost portion of the resist stack, and defining an isotropically developed material adjacent the stabilized resist layer.

16. A method of forming a tiered structure using a multi-layered resist stack as claimed in claim 10 wherein the step of depositing a metal material includes depositing a conductive metal material.

17. A method of forming a tiered structure using a multi-layered resist stack as claimed in claim 10 wherein the step of removing the resist stack and the stabilized resist layer includes immersing the stack in a solvent bath immersion to remove the resist stack and etching to remove the stabilized resist layer.

18. A method of forming a semiconductor device comprising the steps of:
providing a substrate having a surface;
forming a source on an uppermost surface of the substrate;
forming a drain on an uppermost surface of the substrate;
fabricating a tiered structure including the steps of:
providing a substrate having a surface;
depositing and patterning a base resist layer on the surface of the substrate;
stabilizing the patterned base resist layer, thereby forming a stabilized resist layer;
forming a resist stack including an isotropically developing material formed on an uppermost surface of the stabilized resist layer and an imageable material formed on a surface of the isotropically developing material;
patterning, in alignment with an opening defined in the stabilized resist layer, an opening in the resist stack having a reentrant profile and a dimension greater than the opening defined in the stabilized resist layer;
depositing a metal material within the opening defined therein the resist stack and the opening defined therein the stabilized resist layer; and
removing the resist stack and the stabilized resist layer, thereby exposing a tiered structure; and
positioning the tiered structure between the source and the drain, thereby forming a transistor.

19. A method of forming a semiconductor device as claimed in claim 18 wherein the step of depositing a base resist layer on the surface of the substrate includes depositing a low to medium molecular weight, soluble, organic imageable material.

20. A method of forming a tiered structure using a multi-layered resist stack as claimed in claim 19 wherein the step of stabilizing the patterned base resist layer includes the step of exposing the base resist layer to one of a heat source, a light source, a combination of a heat source and a light source, an electron beam irradiation source, and a combination of an electron beam irradiation source and a heat source, thereby increasing the molecular weight of the base resist layer through cross-linking and forming the stabilized resist layer.

21. A method of forming a tiered structure using a multi-layered resist stack as claimed in claim 20 wherein the step of exposing the base resist layer to a light source includes exposing to a deep ultraviolet light source.

22. A method of forming a tiered structure using a multi-layered resist stack as claimed in claim 20 wherein the step of removing the at least one resist layer and the stabilized resist layer includes immersing the stack in a solvent bath immersion to remove the at least one resist layer and etching to remove the stabilized resist layer.

23. A method of forming a tiered structure using a multi-layered resist stack comprising the steps of:
providing a substrate having a surface;
depositing and patterning a base resist layer on the surface of the substrate;
stabilizing the patterned base resist layer, thereby forming a stabilized resist layer;
depositing a resist stack on an uppermost surface of the stabilized resist layer including the step of patterning a reentrant resist profile in the resist stack by diffusing a base into an uppermost portion at the resist stack, wherein the reentrant profile has a dimension greater than the opening defined in the stabilized resist layer, depositing a metal material within the opening defined therein the resist stack and the opening defined therein the stabilized resist layer; and removing the resist stack and the stabilized resist layer, thereby exposing a tiered structure.

24. A method of forming a tiered structure using a multi-layered resist stack as claimed in claim 23 wherein the step of depositing a resist stack on an uppermost surface of the stabilized resist layer includes the step of defining an isotropically developed material adjacent the stabilized resist layer.

* * * * *